(12) United States Patent
Yamamoto

(10) Patent No.: US 10,924,109 B2
(45) Date of Patent: Feb. 16, 2021

(54) FRONT-END CIRCUIT

(71) Applicant: Murata Manufacturing Co., Ltd., Nagaokakyo (JP)

(72) Inventor: Michiyo Yamamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/243,157

(22) Filed: Jan. 9, 2019

(65) Prior Publication Data

US 2019/0260378 A1 Aug. 22, 2019

(30) Foreign Application Priority Data

Feb. 16, 2018 (JP) .................. 2018-026276

(51) Int. Cl.
| | | |
|---|---|---|
| *H03K 17/693* | (2006.01) | |
| *H03K 17/62* | (2006.01) | |
| *H03K 17/567* | (2006.01) | |
| *H03K 17/16* | (2006.01) | |
| *H03K 17/14* | (2006.01) | |
| *H03H 9/46* | (2006.01) | |
| *H03H 7/01* | (2006.01) | |

(52) U.S. Cl.
CPC .......... *H03K 17/693* (2013.01); *H03K 17/14* (2013.01); *H03K 17/162* (2013.01); *H03K 17/567* (2013.01); *H03K 17/62* (2013.01); *H03H 7/0115* (2013.01); *H03H 9/46* (2013.01); *H03K 2217/0018* (2013.01)

(58) Field of Classification Search
CPC .......... H03H 7/00; H03H 7/0115; H03H 9/00; H03H 9/46; H03K 17/00; H03K 17/04123; H03K 17/063; H03K 17/14; H03K 17/162; H03K 17/168; H03K 17/567; H03K 17/62; H03K 17/687; H03K 17/6874; H03K 17/693; H03K 2217/00; H03K 2217/0018
USPC ......................................................... 327/434
See application file for complete search history.

(56) References Cited

U.S. PATENT DOCUMENTS

| | | |
|---|---|---|
| 2010/0225377 A1 | 9/2010 | Okashita |
| 2012/0001676 A1 | 1/2012 | Iraha et al. |
| 2016/0261263 A1* | 9/2016 | Chen ............... H03K 17/06 |

(Continued)

FOREIGN PATENT DOCUMENTS

| | | |
|---|---|---|
| JP | 2010-212801 A | 9/2010 |
| JP | 2012-044637 A | 3/2012 |

(Continued)

*Primary Examiner* — Lincoln D Donovan
*Assistant Examiner* — Dave Mattison

(57) ABSTRACT

A front-end circuit includes a first filter on a path connecting a common terminal and a first input/output terminal, a second filter on a path connecting the common terminal and a second input/output terminal, and a first switch on the path connecting the common terminal and the first input/output terminal. The first switch receives at least one of a first control signal and a second control signal. The first control signal increases a difference between a first voltage applied to the first switch to turn the first switch to a non-conductive state and a threshold voltage determining whether or not the first switch is turned to a conductive state. The second control signal increases a difference between a second voltage applied to the first switch to turn the first switch to the conductive state and the threshold voltage.

20 Claims, 6 Drawing Sheets

(56) References Cited

U.S. PATENT DOCUMENTS

| | | | | |
|---|---|---|---|---|
| 2017/0063404 A1* | 3/2017 | Langer | ............... | H04B 1/0057 |
| 2017/0117933 A1* | 4/2017 | Khlat | ............... | H04B 1/0057 |
| 2017/0244432 A1* | 8/2017 | Ranta | ............... | H04W 88/06 |
| 2017/0331458 A1* | 11/2017 | Tomita | ............... | H03H 9/725 |
| 2019/0123722 A1 | 4/2019 | Nosaka | | |

FOREIGN PATENT DOCUMENTS

| | | |
|---|---|---|
| JP | 2017-152896 A | 8/2017 |
| WO | 2017/217197 A1 | 12/2017 |

\* cited by examiner

FRONT-END CIRCUIT

CROSS REFERENCE TO RELATED APPLICATIONS

This application claims the benefit of priority to Japanese Patent Application No. 2018-026276 filed on Feb. 16, 2018. The entire contents of this application are hereby incorporated herein by reference.

BACKGROUND OF THE INVENTION

1. Field of the Invention

The present invention relates to a front-end circuit capable of handling a plurality of frequency bands.

2. Description of the Related Art

In related art communication devices such as cellular phone terminals and the like, there is a need for multiband capability to enable a single terminal to transmit and receive high frequency signals in a plurality of frequency bands. In response to such need, a circuit (multiplexer) is disclosed (for example, Japanese Unexamined Patent Application Publication No. 2017-152896), in which on the antenna side, for example, a plurality of filters having passbands different from each other are connected in common at their input/output terminals, each of which is one of the input/output terminals of each filter, thus providing the multiband capability.

For example, in the case in which, of a plurality of frequency bands, a certain frequency band (referred to as the first frequency band) is used while another frequency band (referred to as the second frequency band) is not used, a switch may be provided in a path in which a filter having a passband corresponding to the second frequency band is provided, and by turning the switch to a non-conductive state, it possible to prevent the signals from passing through the filter. However, the plurality of filters are connected in common at their input/output terminals, each of which is one of the input/output terminals of each filter. Thus, in the case in which the resistance of the switch when being non-conductive is low, a signal being sent through the path in which the filter corresponding to the first frequency band is disposed may leak into a path in which a filter corresponding to the second frequency band is disposed, thus causing a loss in the signal of the first frequency band. Further, the second frequency band may be used by turning the switch to a conductive state. However, in the case in which the resistance of the switch when being conductive is high, there may be a loss in the signal of the second frequency band. As described above, there is an issue of causing a loss in a signal needed for communication.

SUMMARY OF THE INVENTION

Preferred embodiments of the present invention provide front-end circuits that are each capable of reducing or preventing a loss in a signal needed for communication.

According to a preferred embodiment of the present invention, a front-end circuit includes a first filter on a path connecting a common terminal and a first input/output terminal, a second filter on a path connecting the common terminal and a second input/output terminal, and a first switch on the path connecting the common terminal and the first input/output terminal, wherein the first switch receives a first control signal, a second control signal or both, the first control signal is a signal to increase a difference between a first voltage and a threshold voltage, the first voltage being applied to the first switch to turn the first switch to a non-conductive state, the threshold voltage determining whether the first switch is turned to a conductive state or not, and the second control signal is a signal to increase a difference between a second voltage and the threshold voltage, the second voltage being applied to the first switch to turn the first switch to the conductive state.

With this configuration, when the first switch is turned to the non-conductive state in order to perform communication using the frequency band corresponding to the second filter (namely, when the common terminal and the first input/output terminal are electrically discontinuous), the difference between the first voltage and the threshold voltage increases by inputting the first control signal to the first switch. The resistance of the first switch when being non-conductive changes due to that difference, and as that difference increases, the resistance of the first switch when being non-conductive becomes higher. This makes it difficult for signals to leak from the path on which the second filter is disposed to the path on which the first filter is provided. Further, when the first switch is turned to the conductive state in order to perform communication using the frequency band corresponding to the first filter (namely, when the common terminal and the first input/output terminal are electrically continuous), the difference between the second voltage and the threshold voltage increases by inputting the second control signal to the first switch. The resistance of the first switch when being conductive changes due to that difference, and as that difference increases, the resistance of the first switch when being conductive becomes lower. This reduces or prevents a loss due to the resistance of the first switch when being conductive in the path on which the first filter is disposed. As described above, according to a preferred embodiment of the present invention, the front-end circuit enables the reduction or prevention of a loss in a signal needed for communication.

Further, the first control signal may be input to the first switch when the first switch is turned to the non-conductive state.

With this configuration, when the first switch is turned to the non-conductive state, the resistance of the first switch when being non-conductive becomes higher, thus making it difficult for signals to leak from the path on which the second filter is disposed to the path on which the first filter is disposed and enabling the reduction or prevention of a loss in a signal needed for communication.

Further, the second control signal may be input to the first switch when the first switch is turned to the conductive state.

With this configuration, when the first switch is turned to the conductive state, the resistance of the first switch when being conductive becomes lower, thus enabling the reduction or prevention of a loss due to the resistance of the first switch when being conductive in the path on which the first filter is disposed and enabling the reduction or prevention of a loss in a signal needed for communication.

Further, the first switch may be a metal oxide semiconductor field effect transistor (MOSFET), and the first control signal and the second control signal may be back gate voltages to be applied to a back gate of the first switch.

With this configuration, the difference between the threshold voltage and the first voltage or the difference between the threshold voltage and the second voltage is able to be increased by applying the back gate voltage to the back gate of the first switch.

For example, in the case in which the first switch is an N-channel MOSFET, when the first switch is to be used in the non-conductive state, the first voltage lower than the threshold voltage is applied to the gate. At that time, the threshold voltage is able to be increased by applying a positive back gate voltage to the back gate as the first control signal. This increases the difference between the first voltage and the threshold voltage and increases the resistance of the first switch when being non-conductive. Further, in the case in which the first switch is an N-channel MOSFET, when the first switch is to be used in the conductive state, the second voltage higher than the threshold voltage is applied to the gate. At that time, the threshold voltage is able to be reduced by applying a negative back gate voltage to the back gate as the second control signal. This increases the difference between the second voltage and the threshold voltage and reduces the resistance of the first switch when being conductive.

Further, for example, in the case in which the first switch is a P-channel MOSFET, when the first switch is to be used in the non-conductive state, the first voltage higher than the threshold voltage is applied to the gate. At that time, the threshold voltage is able to be reduced by applying a negative back gate voltage to the back gate as the first control signal. This increases the difference between the first voltage and the threshold voltage and increases the resistance of the first switch when being non-conductive. Further, in the case in which the first switch is a P-channel MOSFET, when the first switch is to be used in the conductive state, the second voltage lower than the threshold voltage is applied to the gate. At that time, the threshold voltage is able to be increased by applying a positive back gate voltage to the back gate as the second control signal. This increases the difference between the second voltage and the threshold voltage and reduces the resistance of the first switch when being conductive.

Further, the first switch may be a bipolar transistor, and the first control signal and the second control signal may be base currents flowing into the base of the first switch.

With this configuration, the difference between the threshold voltage and the first voltage or the difference between the threshold voltage and the second voltage is able to be increased by the base current flowing into the base of the first switch.

For example, in the case in which the first switch is an NPN bipolar transistor, when the first switch is to be used in the non-conductive state, the first voltage lower than the threshold voltage is applied to the base. At that time, the first voltage is able to be reduced by inputting a negative base current to the base as the first control signal. This increases the difference between the first voltage and the threshold voltage and increases the resistance of the first switch when being non-conductive. Further, in the case in which the first switch is an NPN bipolar transistor, when the first switch is to be used in the conductive state, the second voltage higher than the threshold voltage is applied to the base. At that time, the second voltage is able to be increased by inputting a positive base current to the base as the second control signal. This increases the difference between the second voltage and the threshold voltage and reduces the resistance of the first switch when being conductive.

Further, for example, in the case in which the first switch is a PNP bipolar transistor, when the first switch is to be used in the non-conductive state, the first voltage higher than the threshold voltage is applied to the base. At that time, the first voltage is able to be increased by inputting a positive base current to the base as the first control signal. This increases the difference between the first voltage and the threshold voltage and increases the resistance of the first switch when being non-conductive. Further, in the case in which the first switch is a PNP bipolar transistor, when the first switch is to be used in the conductive state, the second voltage lower than the threshold voltage is applied to the base. At that time, the second voltage is able to be reduced by inputting a negative base current to the base as the second control signal. This increases the difference between the second voltage and the threshold voltage and reduces the resistance of the first switch when being conductive.

Further, the timing of applying the first voltage and the timing of inputting the first control signal may be synchronized, and the timing of applying the second voltage and the timing of inputting the second control signal may be synchronized.

With this configuration, a signal source (power supply) to generate the first voltage, the second voltage, the first control signal, and the second control signal is able to be shared, thus providing a simple circuit configuration and reducing or preventing noise generation.

Further, the front-end circuit may further include a second switch on the path connecting the common terminal and the first input/output terminal.

With this configuration, the selection of characteristics of the first switch and the second switch is able to be made in consideration of variation due to temperature, production, and power supply as well as usage of the front-end circuit, and by combining such switches, an improved configuration of the front-end circuit is provided.

For example, the first switch and the second switch may be different types of transistors.

With this configuration, for example, the bipolar transistor has a better distortion characteristic than the MOSFET. On the other hand, because the MOSFET does not require the input current (gate current) that corresponds to the base current in the bipolar transistor, the MOSFET has the capability to provide lower power consumption, is low cost, and has a small area. This provides lower power consumption, lower cost, and smaller area by using a MOSFET for the switch on the first input/output terminal side and reduces or prevents distortion by using a bipolar transistor for the switch on the common terminal side (antenna element side).

Further, for example, the first switch and the second switch may be the same type of transistors.

With this configuration, the first switch and the second switch are able to be provided using, for example, a single chip, thus having a smaller area and a lower cost.

The front-end circuits according to preferred embodiments of the present invention enable the reduction or prevention of a loss in a signal needed for communication.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
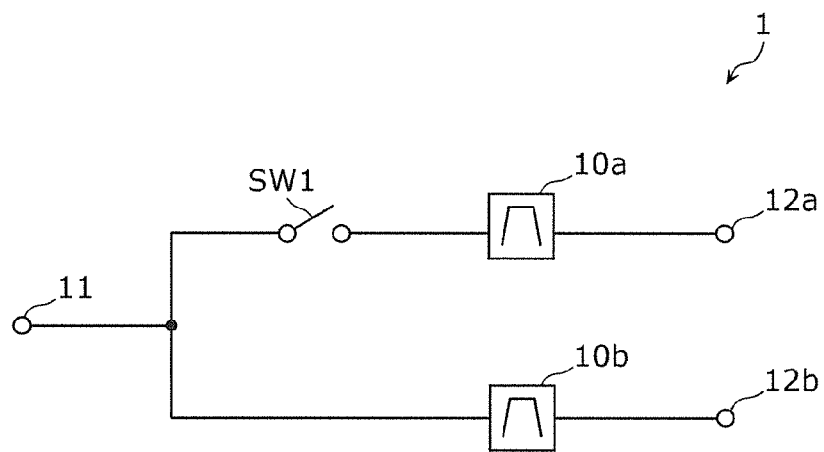
FIG. 1 is a configuration diagram illustrating a front-end circuit according to a preferred embodiment 1 of the present invention.

Hereinafter, preferred embodiments of the present invention will be described in detail with reference to the drawings. It should be noted that the preferred embodiments which will be described below each illustrate a comprehensive or specific example. In the following preferred embodiments, numeric values, shapes, materials, elements, arrangement and connection structures of the elements, and other features are merely examples, and not intended to limit scope of the present invention. Of the elements in the following preferred embodiments, elements that are not described in an independent claim will be described as optional elements. Further, in the drawings, the same reference character is used for the same or substantially the same elements, and in some cases an overlapping description is omitted or simplified. Further, in the following preferred embodiments, the term "connect" includes not only the cases of direct connection, but also the cases where an electrical connection is established with another element or other component interposed therebetween.

Preferred Embodiment 1

First, the configuration of a front-end circuit according to a preferred embodiment 1 of the present invention is described with reference to FIG. 1.

FIG. 1 is a configuration diagram illustrating a front-end circuit 1 according to the preferred embodiment 1.

The front-end circuit 1 includes a filter 10a and a filter 10b. The filter 10a is a first filter on a path connecting a common terminal 11 and an input/output terminal 12a (first input/output terminal). The filter 10b is a second filter on a path connecting the common terminal 11 and an input/output terminal 12b (second input/output terminal). The filters 10a and 10b are, for example, acoustic wave filters, LC filters, or other suitable filters, and are not limited to a specific type of filter. Passbands of the filters 10a and 10b are, for example, different from each other. The common terminal 11 is connected to, for example, an antenna element, and the input/output terminals 12a and 12b are connected to a RF signal processing circuit with an amplifier circuit or a switch, which is different from a switch SW1 described below, interposed therebetween.

Further, the front-end circuit 1 includes the switch SW1. The switch SW1 is a first switch on the path connecting the common terminal 11 and the input/output terminal 12a. As illustrated in FIG. 1, the switch SW1 is connected between the common terminal 11 and the filter 10a, and may alternatively be connected between the filter 10a and the input/output terminal 12a. When the switch SW1 is in the conductive state, the common terminal 11 and the input/output terminal 12a are electrically continuous, and when the switch SW1 is in the non-conductive state, the common terminal and the input/output terminal 12a are electrically discontinuous. When the switch SW1 is turned to the conductive state, communication using the frequency band corresponding to the passband of the filter 10a is enabled, and when the switch SW1 is turned to the non-conductive state, the communication using the frequency band corresponding to the passband of the filter 10a is disabled. Accordingly, when the switch SW1 is turned to the conductive state, it is possible to use carrier aggregation (CA) in which the communication using the frequency band corresponding to the passband of the filter 10a and communication using the frequency band corresponding to the passband of the filter 10b are performed at the same time. On the other hand, when the switch SW1 is turned to the non-conductive state, the communication using the frequency band corresponding to the passband of the filter 10a is disabled, and the communication using the frequency band corresponding to the passband of the filter 10b is enabled.

The switch SW1 is, for example, a single pole single throw (SPST) switch. The switch SW1 is preferably, for example, a MOSFET or a bipolar transistor. Further, the switch SW1 switches between the conductive state and the non-conductive state in response to, for example, a control signal from outside (for example, the RF signal processing circuit).

The switch SW1 receives at least one of the first control signal and the second control signal. The first control signal is a signal to increase a difference between a first voltage to be applied to the switch SW1 in order to turn the switch SW1 to the non-conductive state and a threshold voltage that determines whether the switch SW1 is turned to the conductive state or not. The second control signal is a signal to increase a difference between a second voltage to be applied to the switch SW1 in order to turn the switch SW1 to the conductive state and the threshold voltage. The first voltage and the second voltage are voltages (gate-to-source voltage VGS) to be applied to the gate in the case in which the switch SW1 is a MOSFET, and are voltages (base-to-emitter voltage VBE) to be applied to the base in the case in which the switch SW1 is a bipolar transistor. In the present preferred embodiment, the first control signal is input to the switch SW1 when the switch SW1 is turned to the non-conductive state, and the second control signal is input to the switch SW1 when the switch SW1 is turned to the conductive state.

Next, a specific configuration of the switch SW1 is described with reference to FIGS. 2A and 2B.

Figure 2A:
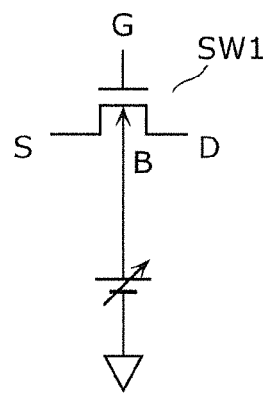
FIG. 2A is a diagram illustrating one example of a switch.

FIG. 2A is a diagram illustrating one example of the switch SW1. FIG. 2B is a diagram illustrating another example of the switch SW1.

As illustrated in FIG. 2A, the switch SW1 is, for example, a MOSFET (preferably N-channel MOSFET in this example). In this case, the switch SW1 includes a gate (G), a source (S), a drain (D), and a back gate (B). The first voltage for turning the switch SW1 to the non-conductive state or the second voltage for turning the switch SW1 to the conductive state is applied to the gate. Of the source and the drain, for example, one is connected to the common terminal 11, and the other is connected to the filter 10a. The first control signal or the second control signal is input (applied) to the back gate. In other words, in the case in which the switch SW1 is a MOSFET, the first control signal and the second control signal are back gate voltages to be applied to the back gate of the switch SW1. When the switch SW1 is turned to the non-conductive state, a positive back gate voltage is applied as the first control signal, and when the switch SW1 is turned to the conductive state, a negative back gate voltage is applied as the second control signal.

Although it is not illustrated, the switch SW1 may alternatively be, for example, a P-channel MOSFET. In this case, when the switch SW1 is turned to the non-conductive state, a negative back gate voltage is applied as the first control signal, and when the switch SW1 is turned to the conductive state, a positive back gate voltage is applied as the second control signal.

Figure 2B:
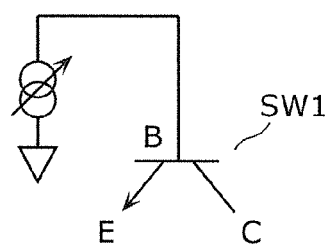
FIG. 2B is a diagram illustrating another example of the switch.

Further, as illustrated in FIG. 2B, the switch SW1 is, for example, a bipolar transistor (preferably NPN bipolar transistor in this example). In this case, the switch SW1 includes a base (B), an emitter (E), and a collector (C). The first voltage for turning the switch SW1 to the non-conductive state or the second voltage for turning the switch SW1 to the conductive state is applied to the base. Of the emitter and the collector, for example, one is connected to the common terminal 11, and the other is connected to the filter 10a. Further, the first control signal or the second control signal is input to the base. In other words, in the case in which the switch SW1 is a bipolar transistor, the first control signal and the second control signal are base currents to be input to the base of the switch SW1. When the switch SW1 is turned to the non-conductive state, a negative base current is input as the first control signal, and when the switch SW1 is turned to the conductive state, a positive base current is input as the second control signal.

Although it is not illustrated, the switch SW1 may alternatively be, for example, a PNP bipolar transistor. In this case, when the switch SW1 is turned to the non-conductive state, a positive base current is input as the first control signal, and when the switch SW1 is turned to the conductive state, a negative base current is input as the second control signal.

Further, the switch SW1 may alternatively include a plurality of transistors. Such examples are described with reference to FIGS. 3A and 3B.

Figure 3A:
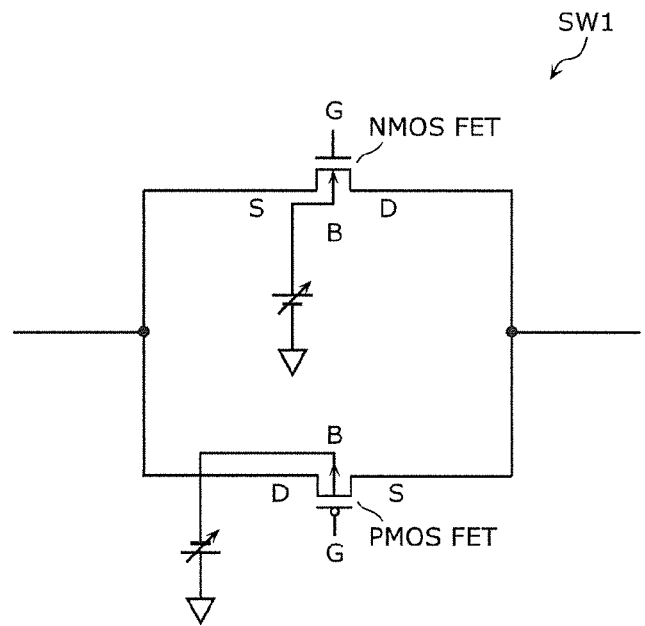
FIG. 3A is a diagram illustrating one example of a switch including a plurality of transistors.
Figure 3B:
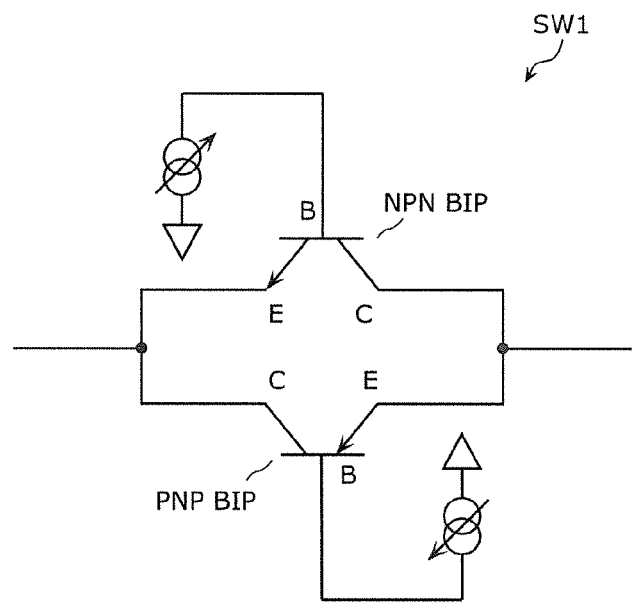
FIG. 3B is a diagram illustrating another example of the switch including a plurality of transistors.

FIG. 3A is a diagram illustrating one example of the switch SW1 including a plurality of transistors. FIG. 3B is a diagram illustrating another example of the switch SW1 including a plurality of transistors.

As illustrated in FIG. 3A, the switch SW1 preferably includes, for example, an N-channel MOSFET and a P-channel MOSFET that are connected in parallel. In this case, the first voltage for turning the switch SW1 to the non-conductive state or the second voltage for turning the switch SW1 to the conductive state is applied to the gate of each MOSFET of the switch SW1, and the first control signal or the second control signal is input (applied) to the back gate thereof. When the switch SW1 is turned to the non-conductive state, as the first control signal, a positive back gate voltage is applied to the NMOSFET and a negative back gate voltage is applied to the PMOSFET, and when the switch SW1 is turned to the conductive state, as the second control signal, a negative back gate voltage is applied to the NMOSFET and a positive back gate voltage is applied to the PMOSFET.

Further, as illustrated in FIG. 3B, the switch SW1 preferably includes, for example, an NPN bipolar transistor and a PNP bipolar transistor that are connected in parallel. In this case, the first voltage for turning the switch SW1 to the non-conductive state or the second voltage for turning the switch SW1 to the conductive state is applied to the base of each bipolar transistor of the switch SW1. Further, the first control signal or the second control signal is input to the base. When the switch SW1 is turned to the non-conductive state, as the first control signal, a negative base current is input to the NPN bipolar transistor and a positive base current is input to the PNP bipolar transistor, and when the switch SW1 is turned to the conductive state, as the second control signal, a positive base current is input to the NPN bipolar transistor and a negative base current is input to the PNP bipolar transistor.

As described above, by using the MOSFET which is an active element, it is possible to provide compatibility with integrated circuits. Further, the MOSFET is a voltage-driven device, and does not require drive current which enables lower power consumption. Further, by connecting the MOSFETs in parallel, the resistance when being conductive is reduced. Further, although there is a range in which the on/off operation of the P-channel MOSFET is difficult to perform or a range in which the on/off operation of the N-channel MOSFET is difficult to perform depending on the drain voltage and the source voltage, each MOSFET is able to be operated in a complementary manner when the MOSFETs are connected in parallel.

Further, by using the bipolar transistor which is an active element, it becomes possible to provide compatibility with integrated circuits. Further, by connecting the bipolar transistors in parallel, the resistance when being conductive is able to be reduced. Further, although there is a range in which the on/off operation of the PNP bipolar transistor is difficult to perform or a range in which the on/off operation of the NPN bipolar transistor is difficult to perform depending on the emitter voltage and the collector voltage, each bipolar transistor is able to be operated in a complementary manner when the bipolar transistors are connected in parallel.

Next, details of the first control signal and the second control signal are described with reference to FIG. 4 to FIG. 7.

Figure 4:
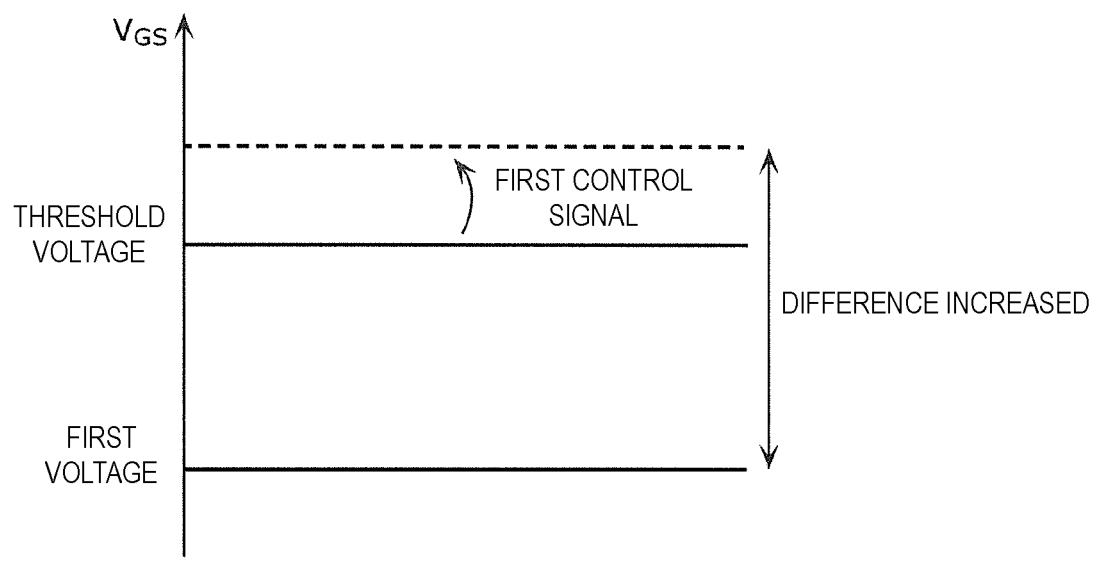
FIG. 4 is a diagram for describing a first control signal in the case in which the switch is an N-channel MOSFET.

FIG. 4 is a diagram for describing the first control signal in the case in which the switch SW1 is an N-channel MOSFET. Specifically, FIG. 4 illustrates a relationship between the threshold voltage and the first voltage when the switch SW1 is turned to the non-conductive state. The switch SW1 is turned to the non-conductive state by applying the first voltage (gate-to-source voltage VGS) lower than the threshold voltage to the gate of the switch SW1. In this case, by applying a positive back gate voltage to the back gate of the switch SW1 as the first control signal, the threshold voltage becomes higher, and a difference between the first voltage and the threshold voltage increases. The resistance of the switch SW1 when being non-conductive changes due to that difference, and as that difference increases, the resistance of the switch SW1 when being non-conductive becomes higher, thus increasing the resistance of the switch SW1 when being non-conductive. For example, the resistance of the switch SW1 when being non-conductive is able to be increased from several MΩ to several GΩ.

Figure 5:
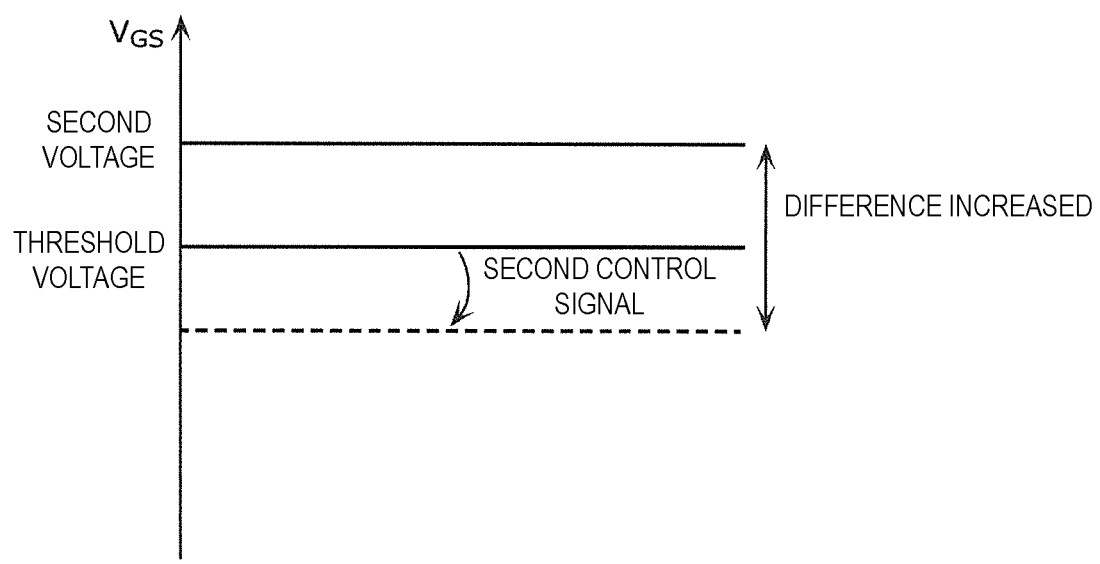
FIG. 5 is a diagram for describing a second control signal in the case in which the switch is an N-channel MOSFET.

FIG. 5 is a diagram for describing the second control signal in the case in which the switch SW1 is an N-channel MOSFET. Specifically, FIG. 5 illustrates a relationship between the threshold voltage and the second voltage when the switch SW1 is turned to the conductive state. The switch SW1 is turned to the conductive state by applying the second voltage (gate-to-source voltage VGS) higher than the threshold voltage to the gate of the switch SW1. In this case, by applying a negative back gate voltage to the back gate of the switch SW1 as the second control signal, the threshold voltage becomes lower, and a difference between the second voltage and the threshold voltage increases. The resistance of the switch SW1 when being conductive changes due to that difference, and as that difference increases, the resistance of the first switch when being conductive becomes lower, thus reducing the resistance of the switch SW1 when being conductive. For example, the resistance of the switch SW1 when being conductive is able to be reduced from several Ω to several mΩ.

Although it is not illustrated, in the case in which the switch SW1 is a P-channel MOSFET, the switch SW1 is turned to the non-conductive state by applying a first voltage (gate-to-source voltage VGS) higher than a threshold voltage to the gate of the switch SW1. In this case, by applying a negative back gate voltage to the back gate of the switch SW1 as the first control signal, the threshold voltage becomes lower, and a difference between the first voltage and the threshold voltage increases. This increases the resistance of the switch SW1 when being non-conductive.

Further, although it is not illustrated, in the case in which the switch SW1 is a P-channel MOSFET, the switch SW1 is turned to the conductive state by applying a second voltage (gate-to-source voltage VGS) lower than a threshold voltage to the gate of the switch SW1. In this case, by applying a positive back gate voltage to the back gate of the switch SW1 as the second control signal, the threshold voltage becomes higher, and a difference between the second voltage and the threshold voltage increases. This reduces the resistance of the switch SW1 when being conductive.

It is conceivable that, even without inputting the first control signal or the second control signal to the back gate, the difference between the first voltage and the threshold voltage or the difference between the second voltage and the threshold voltage may be increased by changing the first voltage or the second voltage itself. However, in general, the back gate of MOSFET is shorted with a ground, a power supply, the drain, or the source, and a certain voltage is applied thereto. At this state, the first voltage at which the resistance of MOSFET when being non-conductive is the highest and the second voltage at which the resistance of MOSFET when being conductive is the lowest are applied. In other words, in general, the first voltage and the second voltage are in the state in which no further changes are able to be made, and the resistance when being non-conductive and the resistance when being conductive are in the state in which no further changes are able to be made. In preferred embodiments of the present invention, because the threshold voltage is being changed, these resistances are able to be further changed.

Figure 6:
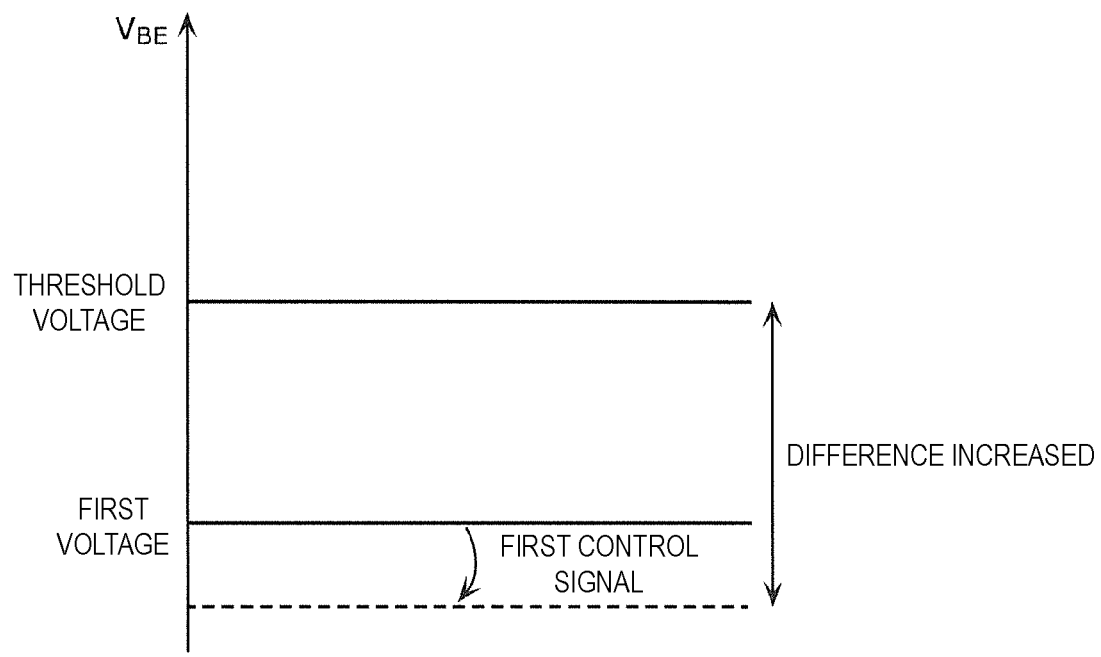
FIG. 6 is a diagram for describing the first control signal in the case in which the switch is an NPN bipolar transistor.

FIG. 6 is a diagram for describing the first control signal in the case in which the switch SW1 is an NPN bipolar transistor. Specifically, FIG. 6 illustrates a relationship between a threshold voltage and a first voltage when the switch SW1 is turned to the non-conductive state. The switch SW1 is turned to the non-conductive state by applying the first voltage (base-to-emitter voltage VBE) lower than the threshold voltage (preferably, for example, about 0.6 V to about 0.7 V) to the base of the switch SW1. In this case, by inputting a negative base current to the base of the switch SW1 as the first control signal, the first voltage becomes lower, and a difference between the first voltage and the threshold voltage increases. This reduces the change in output current of the switch SW1 in response to the change in VBE, thus enabling the resistance of the switch SW1 when being non-conductive to become higher.

Figure 7:
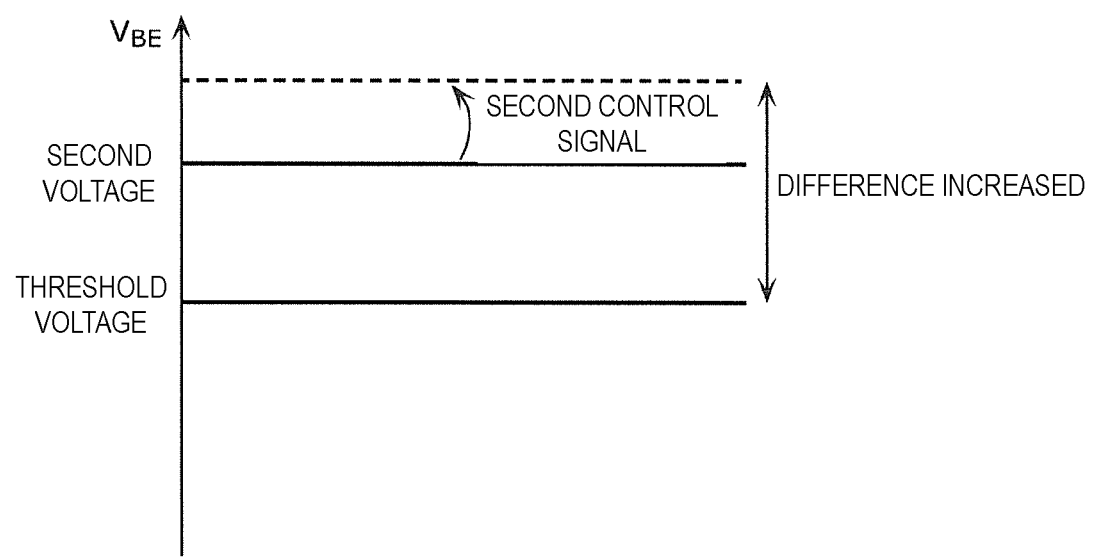
FIG. 7 is a diagram for describing the second control signal in the case in which the switch is an NPN bipolar transistor.

FIG. 7 is a diagram for describing the second control signal in the case in which the switch SW1 is an NPN bipolar transistor. Specifically, FIG. 7 illustrates a relationship between a threshold voltage and a second voltage when the switch SW1 is turned to the conductive state. The switch SW1 is turned to the conductive state by applying the second voltage (base-to-emitter voltage VBE) higher than the threshold voltage (preferably, for example, about 0.6 V to about 0.7 V) to the base of the switch SW1. In this case, by inputting a positive base current to the base of the switch SW1 as the second control signal, the second voltage becomes higher, and a difference between the second voltage and the threshold voltage increases. This increases the change in output current of the switch SW1 in response to the change in VBE, thus enabling the resistance of the switch SW1 when being conductive to become lower.

Although it is not illustrated, in the case in which the switch SW1 is a PNP bipolar transistor, the switch SW1 is turned to the non-conductive state by applying a first voltage (base-to-emitter voltage VBE) higher than a threshold voltage to the base of the switch SW1. In this case, by inputting a positive base current to the base of the switch SW1 as the first control signal, the first voltage becomes higher, and a difference between the first voltage and the threshold voltage increases. This enables the resistance of the switch SW1 when being non-conductive to become higher.

Further, although it is not illustrated, in the case in which the switch SW1 is a PNP bipolar transistor, the switch SW1 is turned to the conductive state by applying a second voltage (base-to-emitter voltage VBE) lower than a threshold voltage to the base of the switch SW1. In this case, by inputting a negative base current to the base of the switch SW1 as the second control signal, the second voltage becomes lower, and a difference between the second voltage and the threshold voltage increases. This enables the resistance of the switch SW1 when being conductive to become lower.

Next, input timings of the first voltage, the second voltage, the first control signal, and the second control signal are described with reference to FIG. 8.

Figure 8:
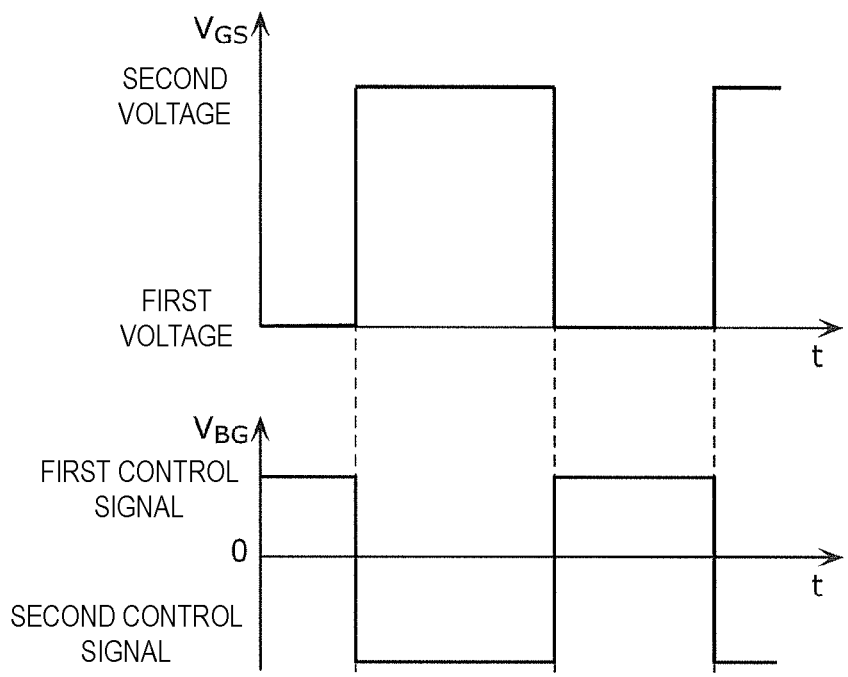
FIG. 8 is a timing chart of a control signal to be input and a voltage to be applied to the switch.

FIG. 8 is a timing chart of voltages (first voltage and second voltage) to be applied and control signals (first control signal and second control signal) to be input to the switch SW1. In the following, the case in which the switch SW1 is an N-channel MOSFET is described.

As illustrated in FIG. 8, the timing of applying the first voltage and the timing of inputting the first control signal are synchronized, and the timing of applying the second voltage and the timing of inputting the second control signal are synchronized. For example, these timings may be synchronized by using a common signal source (power supply) to generate the first voltage, the second voltage, the first control signal, and the second control signal. In the case in which the switch SW1 is a MOSFET, the signal source is, for example, a DC-DC converter for other suitable source, and is connected to the gate and the back gate. At that time, a voltage-dividing circuit may be used to differentiate a gate voltage to be applied to the gate and a back gate voltage to be applied to the back gate. For example, in the case in which the first voltage is output from a signal source and applied to the gate, the first control signal is able to be applied to the back gate by dividing that first voltage using a voltage-dividing circuit or other suitable circuit.

Accordingly, by enabling the sharing of the signal source, a simple circuit configuration is provided, and sources of noise generation are reduced, thus reducing or preventing noise generation.

As described above, when the switch SW1 is turned to the non-conductive state to perform communication using the frequency band corresponding to the filter 10b (namely, when the common terminal 11 and the input/output terminal 12a are electrically discontinuous), the difference between the first voltage and the threshold voltage increases by inputting the first control signal to the switch SW1. The resistance of the switch SW1 when being non-conductive changes due to that difference, and as that difference increases, the resistance of the switch SW1 when being non-conductive becomes higher. This makes it difficult for signals to leak from the path on which the filter 10b is disposed to the path on which the filter 10a is disposed. Further, when the switch SW1 is turned to the conductive state in order to perform communication using the frequency band corresponding to the filter 10a (namely, when the common terminal 11 and the input/output terminal 12a are made electrically continuous), the difference between the second voltage and the threshold voltage increases by inputting the second control signal to the switch SW1. The resistance of the switch SW1 when being conductive changes due to that difference, and as that difference increases, the resistance of the switch SW1 when being conductive becomes lower. This enables the reduction or prevention of a loss due to the resistance of the switch SW1 when being conductive in the path on which the filter 10a is disposed. As described above, according to the present preferred embodiments of the present invention, the front-end circuit 1 enables the reduction of prevention of a loss in a signal needed for communication.

Preferred Embodiment 2

Next, the configuration of a front-end circuit according to a preferred embodiment 2 of the present invention is described with reference to FIG. 9.

Figure 9:
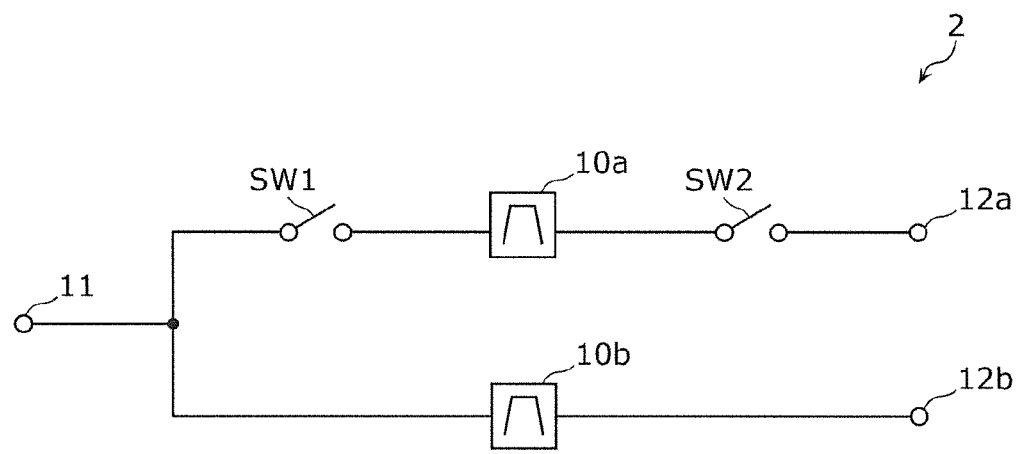
FIG. 9 is a configuration diagram illustrating a front-end circuit according to a preferred embodiment 2 of the present invention.

FIG. 9 is a configuration diagram illustrating a front-end circuit 2 according to the preferred embodiment 2. The front-end circuit 2 according to the present preferred embodiment is different from the front-end circuit 1 according to the preferred embodiment 1 in that the front-end circuit 2 further includes a switch SW2. The remaining portions are the same or substantially the same as those of the front-end circuit 1 according to the preferred embodiment 1, and thus the description thereof is omitted.

The switch SW2 is a second switch on the path connecting the common terminal 11 and the input/output terminal 12a. As illustrated in FIG. 9, the switch SW2 is connected between the filter 10a and the input/output terminal 12a, and may alternatively be connected between the switch SW1 and the filter 10a. When the switch SW1 and the switch SW2 are turned to the conductive state, the common terminal 11 and the input/output terminal 12a become electrically continuous, and when the switch SW1 and the switch SW2 are turned to the non-conductive state, the common terminal 11 and the input/output terminal 12a become electrically discontinuous. When the switch SW1 and the switch SW2 are turned to the conductive state, communication using the frequency band corresponding to the passband of the filter 10a is enabled, and when the switch SW1 and the switch SW2 are turned to the non-conductive state, the communication using the frequency band corresponding to the passband of the filter 10a is disabled. Accordingly, when the switch SW1 and the switch SW2 are turned to the conductive state, it becomes possible to use CA in which the communication using the frequency band corresponding to the passband of the filter 10a and communication using the frequency band corresponding to the passband of the filter 10b are performed at the same time. On the other hand, when the switch SW1 and the switch SW2 are turned to the non-conductive state, the communication using the frequency band corresponding to the passband of the filter 10a is disabled, and the communication using the frequency band corresponding to the passband of the filter 10b is enabled.

The switch SW2 is, for example, a SPST switch. The switch SW2 is preferably, for example, a MOSFET or a bipolar transistor. Further, the switch SW2 switches between the conductive state and the non-conductive state in response to, for example, a control signal from outside (for example, the RF signal processing circuit). For example, as with the switch SW1, the switch SW2 receives at least one of the first control signal and the second control signal. This increases the resistance of the switch SW2 when being non-conductive by use of the first control signal and reduces the resistance of the switch SW2 when being conductive by use of the second control signal. Note that the switch SW2 does not need to receive at least one of the first control signal and the second control signal.

Accordingly, in the present preferred embodiment, the front-end circuit 2 includes a plurality of switches (two switches SW1 and SW2 in this example). This enables the selection of characteristics for each switch (switch SW1 and switch SW2 in this example) in consideration of variations due to temperature, production, and power supply as well as usage of the front-end circuit, and combining such switches provides an optimum configuration of the front-end circuit.

The relevant standard requires front-end circuits of cellular phones and other devices to use control interfaces that conform to Mobile Industry Processor Interface (MIPI) standards. However, the bipolar transistor by itself cannot receive such logic control, and thus at least a MOSFET is used. Note, however, that the bipolar transistor and the MOSFET have their own merits. For example, the bipolar transistor has a better distortion characteristic than the MOSFET. On the other hand, because the MOSFET does not require the input current (gate current) that corresponds to the base current in the bipolar transistor, the MOSFET has a low power consumption, a low cost, and a small area. Therefore, the switch SW1 and the switch SW2 may alternatively be different types of transistors. Specifically, the switch SW1 and the switch SW2 may alternatively be a MOSFET and a bipolar transistor. This provides lower power consumption, lower cost, and smaller area by using a MOSFET for the switch on the first input/output terminal side and reduces or prevents distortion by using a bipolar transistor for the switch on the common terminal side (antenna element side) using a bipolar transistor.

Further, for example, the switch SW1 and the switch SW2 may alternatively be the same type of transistors. This enables the switch SW1 and the switch SW2 to be, for example, a single chip, thus providing smaller area and lower cost.

Preferred Embodiment 3

Next, the configuration of a front-end circuit according to a preferred embodiment 3 of the present invention is described with reference to FIG. 10.

Figure 10:
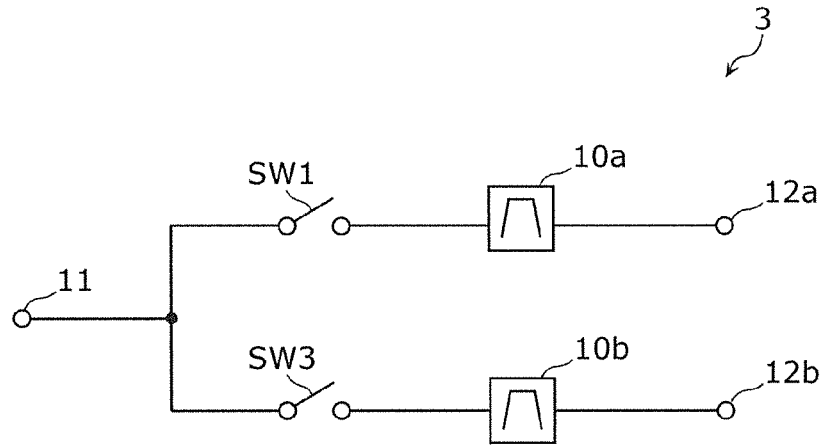
FIG. 10 is a configuration diagram illustrating a front-end circuit according to a preferred embodiment 3 of the present invention.

FIG. 10 is a configuration diagram illustrating a front-end circuit 3 according to the preferred embodiment 3. The front-end circuit 3 according to the present preferred embodiment is different from the front-end circuit 1 according to the preferred embodiment 1 in that the front-end circuit 3 further includes a switch SW3. The remaining portion are the same or substantially the same as those of the front-end circuit 1 according to the preferred embodiment 1, and thus the description thereof is omitted.

The switch SW3 is on the path connecting the common terminal 11 and the input/output terminal 12b. As illustrated in FIG. 10, the switch SW3 is connected between the common terminal 11 and the filter 10b, and may alternatively be connected between the filter 10b and the input/output terminal 12b. When the switch SW3 is turned to the conductive state, the common terminal 11 and the input/output terminal 12b become electrically continuous, and when the switch SW3 is turned to the non-conductive state, the common terminal 11 and the input/output terminal 12b become electrically discontinuous. When the switch SW3 is turned to the conductive state, communication using the frequency band corresponding to the passband of the filter 10b is enabled, and when the switch SW3 is turned to the non-conductive state, the communication using the frequency band corresponding to the passband of the filter 10b is disabled. Accordingly, when the switch SW1 and the switch SW3 are turned to the conductive state, it is possible to use CA in which the communication using the frequency band corresponding to the passband of the filter 10a and the communication using the frequency band corresponding to the passband of the filter 10b are performed at the same time. When the switch SW1 is turned to the non-conductive state and the switch SW3 is turned to the conductive state, the communication using the frequency band corresponding to the passband of the filter 10a is disabled, and the communication using the frequency band corresponding to the passband of the filter 10b is enabled. Further, when the switch SW1 is turned to the conductive state and the switch SW3 is turned to the non-conductive state, the communication using the frequency band corresponding to the passband of the filter 10b is disabled, and the communication using the frequency band corresponding to the passband of the filter 10a is enabled.

The switch SW3 is, for example, a SPST switch. The switch SW3 is preferably, for example, a MOSFET or a bipolar transistor. Further, the switch SW3 switches between the conductive state and the non-conductive state in response to, for example, a control signal from outside (for example, the RF signal processing circuit). As with the switch SW1, the switch SW3 also receives at least one of the first control signal and the second control signal. This increases the resistance of the switch SW3 when being non-conductive by use of the first control signal and reduces the resistance of the switch SW3 when being conductive by use of the second control signal.

As described above, by providing the switch on each path, it is possible to select the communication to be perform from the communication using the frequency band corresponding to the passband of the filter 10a and the communication using the frequency band corresponding to the passband of the filter 10b.

Note that the switches SW1 and SW3 are each a SPST switch, and may alternatively be a single pole double throw (SPDT) switch that combines these switches.

Figure 11:
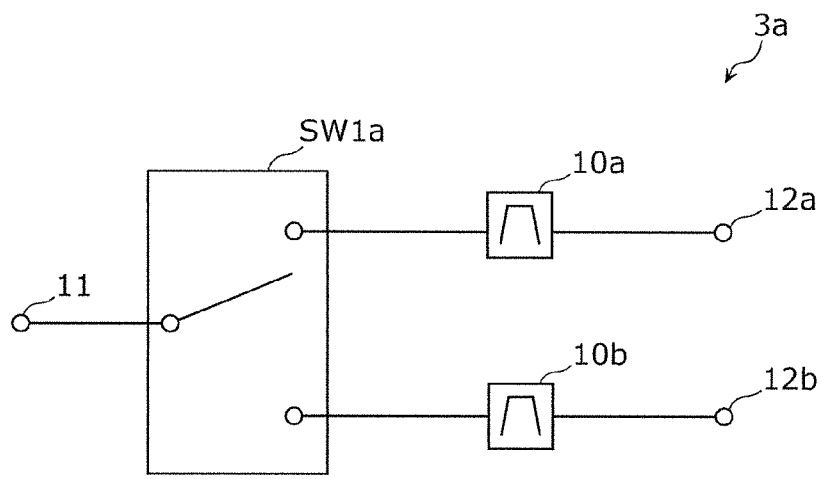
FIG. 11 is a configuration diagram illustrating a front-end circuit according to a modified example of the preferred embodiment 3 of the present invention.

FIG. 11 is a configuration diagram illustrating a front-end circuit 3a according to a modified example of the preferred embodiment 3. In this case, in the SPDT switch 1a, a switch that switches electrical continuity and discontinuity between the common terminal 11 and the input/output terminal 12a corresponds to the switch SW1 on the path connecting the common terminal 11 and the input/output terminal 12a. Further, the switch 1a is a switch capable of providing electrical continuity at the same time both between of the common terminal 11 and the input/output terminal 12a and between the common terminal 11 and the input/output terminal 12b. This enables use of CA in which the communication using the frequency band corresponding to the passband of the filter 10a and the communication using the frequency band corresponding to the passband of the filter 10b are performed at the same time.

Preferred Embodiment 4

Next, the configuration of a front-end circuit according to a preferred embodiment 4 of the present invention is described with reference to FIG. 12.

Figure 12:
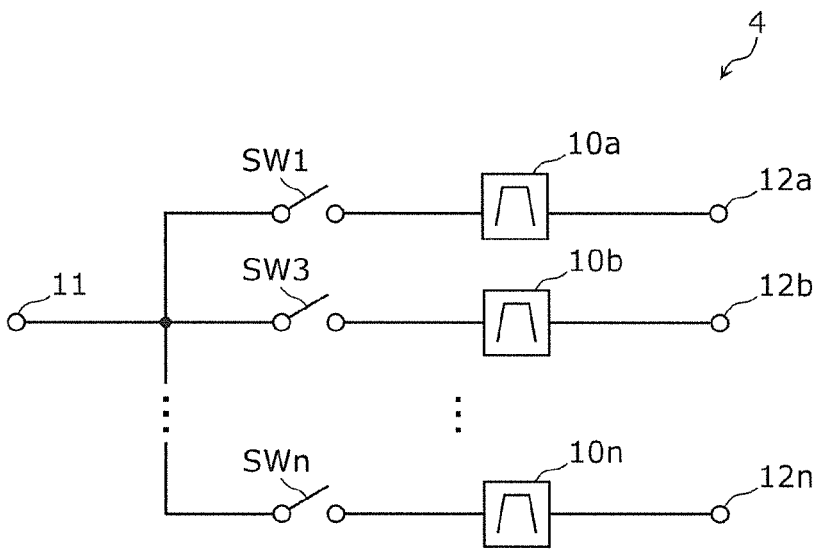
FIG. 12 is a configuration diagram illustrating a front-end circuit according to a preferred embodiment 4 of the present invention.

FIG. 12 is a configuration diagram illustrating a front-end circuit 4 according to the preferred embodiment 4. In the present preferred embodiment, the front-end circuit 4 includes three or more input/output terminals 12a to 12n, and a filter is disposed on a path connecting the common terminal 11 and each input/output terminal. Note that a filter is not necessarily disposed on all of the paths. Further, the front-end circuit 4 includes three or more switches SW1 to SWn disposed on those paths. The remaining portions are the same or substantially the same as those of the front-end circuit 3 according to the preferred embodiment 3, and thus the description thereof is omitted.

As with the switch SW1, each of the switches included in the front-end circuit 4 switches electrical continuity and discontinuity between the common terminal 11 and the input/output terminal connected to the path on which the switch is disposed, and is preferably, for example, a MOSFET or a bipolar transistor. As with the switch SW1, each switch receives at least one of the first control signal and the second control signal. This increases the resistance of each switch when being non-conductive by use of the first control signal and reduce the resistance of each switch when being conductive by use of the second control signal.

Accordingly, the front-end circuit 4 handles three or more frequency bands and enables communication to be performed at a desired frequency band. Alternatively, instead of using the switches SW1 to SWn that are each a SPST switch, a single pole n throw (SPnT: n is an integer greater than or equal to three) switch may be used.

Although the front-end circuits according to the present invention have been described above using the preferred embodiments, the present invention is not limited to the foregoing preferred embodiments. The present invention includes other preferred embodiments that may be provided by combining arbitrary elements of the foregoing preferred embodiments, modified examples that may be obtained by applying, to the foregoing preferred embodiments, various modifications conceivable to those skilled in the art without departing from the scope of the present invention, and various devices that include therein front-end circuits according to preferred embodiments of the present invention.

For example, in the foregoing preferred embodiments, the first control signal is input to the switch SW1 when the switch SW1 is turned to the non-conductive state, and the second control signal is input to the switch SW1 when the switch SW1 is turned to the conductive state. However, the present invention is not limited thereto. For example, only one of the first control signal and the second control signal may be input to the switch SW1. In other words, the first control signal may not be input to the switch SW1 even when the switch SW1 is turned to the non-conductive state, and the second control signal may be input to the switch SW1 when the switch SW1 is turned to the conductive state. Alternatively, the first control signal may be input to the switch SW1 when the switch SW1 is turned to the non-conductive state, and the second control signal may not be input to the switch SW1 even when the switch SW1 is turned to the conductive state.

Further, for example, in the foregoing preferred embodiments, the timing of applying the first voltage and the timing of inputting the first control signal are synchronized, and the timing of applying the second voltage and the timing of inputting the second control signal are synchronized. However, preferred embodiments of the present invention are not limited thereto. For example, these timings are not necessarily synchronized.

Further, for example, as with the preferred embodiment 2, in the preferred embodiments 1, 3, and 4, another switch may be disposed on the path connecting the common terminal 11 and each input/output terminal. Further, for example, on that path, another element other than the switch and the filter described in the foregoing preferred embodiments may be disposed.

Preferred embodiments of the present invention may be applied to communication devices, such as cellular phones and other devices as front-end circuits applicable to multi-band systems.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A front-end circuit comprising:
a first filter on a path connecting a common terminal and a first input/output terminal;
a second filter on a path connecting the common terminal and a second input/output terminal; and
a first switch on the path connecting the common terminal and the first input/output terminal; wherein
the first switch receives a first control signal, a second control signal or both of the first and second control signals;
the first control signal increases a difference between a first voltage and a threshold voltage, the first voltage being applied to the first switch to turn the first switch to a non-conductive state, the threshold voltage determining whether or not the first switch is turned to a conductive state; and
the second control signal increases a difference between a second voltage and the threshold voltage, the second voltage being applied to the first switch to turn the first switch to the conductive state.

2. The front-end circuit according to claim 1, wherein the first control signal is input to the first switch when the first switch is turned to the non-conductive state.

3. The front-end circuit according to claim 1, wherein the second control signal is input to the first switch when the first switch is turned to the conductive state.

4. The front-end circuit according to claim 1, wherein the first switch includes a metal oxide semiconductor field effect transistor (MOSFET); and
the first control signal and the second control signal are back gate voltages to be applied to a back gate of the first switch.

5. The front-end circuit according to claim 4, wherein the first switch includes an N-channel MOSFET;
a positive back gate voltage is applied as the first control signal when the first switch is turned to the non-conductive state; and
a negative back gate voltage is applied as the second control signal when the first switch is turned to the conductive state.

6. The front-end circuit according to claim 4, wherein the first switch includes a P-channel MOSFET;
a negative back gate voltage is applied as the first control signal when the first switch is turned to the non-conductive state; and
a positive back gate voltage is applied as the second control signal when the first switch is turned to the conductive state.

7. The front-end circuit according to claim 1, wherein the first switch includes a bipolar transistor; and
the first control signal and the second control signal are base currents flowing into a base of the first switch.

8. The front-end circuit according to claim 7, wherein the first switch includes an NPN bipolar transistor;
a negative base current is applied as the first control signal when the first switch is turned to the non-conductive state; and
a positive base current is applied as the second control signal when the first switch is turned to the conductive state.

9. The front-end circuit according to claim 7, wherein the first switch includes a PNP bipolar transistor;
a positive base current is applied as the first control signal when the first switch is turned to the non-conductive state; and
a negative base current is applied as the second control signal when the first switch is turned to the conductive state.

10. The front-end circuit according to claim 1, wherein timing of applying the first voltage and timing of inputting the first control signal are synchronized; and
timing of applying the second voltage and timing of inputting the second control signal are synchronized.

11. The front-end circuit according to claim 1, further comprising:
a second switch on the path connecting the common terminal and the first input/output terminal.

12. The front-end circuit according to claim 11, wherein the first switch and the second switch include different types of transistors.

13. The front-end circuit according to claim 11, wherein the first switch and the second switch include the same type of transistors.

14. The front-end circuit according to claim 1, further comprising:
a second switch on the path connecting the common terminal and the second input/output terminal.

15. The front-end circuit according to claim 14, wherein the first and second switches are defined by a single pole double throw switch.

16. The front-end circuit according to claim 1, further comprising:
a third filter on a path connecting the common terminal and a third input/output terminal.

17. The front-end circuit according to claim 16, further comprising:

a third switch on the path connecting the common terminal and the third input/output terminal.

18. The front-end circuit according to claim 1, wherein the first and second filters are acoustic wave filters or LC filters.

19. The front-end circuit according to claim 16, wherein the first, second, and third filters are acoustic wave filters or LC filters.

20. The front-end circuit according to claim 1, wherein passbands of the first and second filters are different from each other.

* * * * *